United States Patent
Hsu

(10) Patent No.: US 10,396,135 B2
(45) Date of Patent: Aug. 27, 2019

(54) OLED SUBSTRATE AND MANUFACTURING METHOD THEREOF, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Minghung Hsu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/843,944

(22) Filed: Dec. 15, 2017

(65) Prior Publication Data
US 2018/0331164 A1    Nov. 15, 2018

(30) Foreign Application Priority Data
May 12, 2017   (CN) .......................... 2017 1 0336006

(51) Int. Cl.
*H01L 27/32*    (2006.01)
*H01L 51/52*    (2006.01)
*H01L 51/56*    (2006.01)

(52) U.S. Cl.
CPC ...... *H01L 27/3246* (2013.01); *H01L 27/3248* (2013.01); *H01L 27/3262* (2013.01);
(Continued)

(58) Field of Classification Search
CPC ............. H01L 27/3246; H01L 27/3248; H01L 27/3262; H01L 51/5218; H01L 51/56
See application file for complete search history.

(56) References Cited

U.S. PATENT DOCUMENTS

2005/0236629 A1   10/2005  Lee et al.
2010/0231543 A1*  9/2010  Momose .............. G06F 3/0412
                                                345/173
(Continued)

FOREIGN PATENT DOCUMENTS

CN        1979840 A      6/2007
CN      101436608 A      5/2009
(Continued)

OTHER PUBLICATIONS

Chinese office action dated May 3, 2018 for corresponding application No. 201710336006.X with English translation attached.

*Primary Examiner* — Christine A Enad
(74) *Attorney, Agent, or Firm* — Nath, Goldberg & Meyer; Joshua B. Goldberg; Daniel Bissing

(57) ABSTRACT

The application provides an OLED substrate, a method for manufacturing the OLED substrate, and a display device. The OLED substrate comprises a plurality of pixel regions, at least one of which is provided with a pixel driving circuit, and includes a display region and a connection region. The OLED substrate comprising: a base; a reflective electrode layer disposed on the base, wherein each reflective electrode is correspondingly disposed in one display region; a pixel defining layer disposed on the reflective electrode layer, wherein the pixel defining layer is provided with a first opening corresponding to the display region and a second opening corresponding to the connection region; a light-emitting material layer disposed in the first opening; a display electrode continuously disposed on the light-emitting material layer and in the second opening, and the display electrodes in the respective pixel regions electrically insulated from each other.

16 Claims, 2 Drawing Sheets

(52) U.S. Cl.
CPC .......... *H01L 51/5218* (2013.01); *H01L 51/56* (2013.01); *H01L 2227/323* (2013.01); *H01L 2251/301* (2013.01); *H01L 2251/303* (2013.01); *H01L 2251/5315* (2013.01); *H01L 2251/558* (2013.01)

(56) References Cited

U.S. PATENT DOCUMENTS

| | | | | |
|---|---|---|---|---|
| 2011/0250713 | A1* | 10/2011 | Kawasaki | H01L 29/458 438/34 |
| 2012/0069064 | A1* | 3/2012 | Yamakita | G02F 1/167 345/690 |
| 2013/0134360 | A1* | 5/2013 | Nakanotani | H01L 51/5012 252/500 |
| 2014/0183502 | A1* | 7/2014 | Song | H01L 27/3246 257/40 |
| 2015/0243676 | A1* | 8/2015 | Jung | H01L 51/5243 257/72 |
| 2016/0111478 | A1* | 4/2016 | Hong | H01L 27/3225 257/40 |
| 2017/0053976 | A1* | 2/2017 | Oh | H01L 51/0097 |
| 2017/0352718 | A1* | 12/2017 | Kim | H01L 27/1225 |

FOREIGN PATENT DOCUMENTS

| | | |
|---|---|---|
| CN | 101496087 A | 7/2009 |
| CN | 103915482 A | 7/2014 |
| CN | 104733501 A | 6/2015 |
| JP | 2007200887 A | 8/2007 |

\* cited by examiner

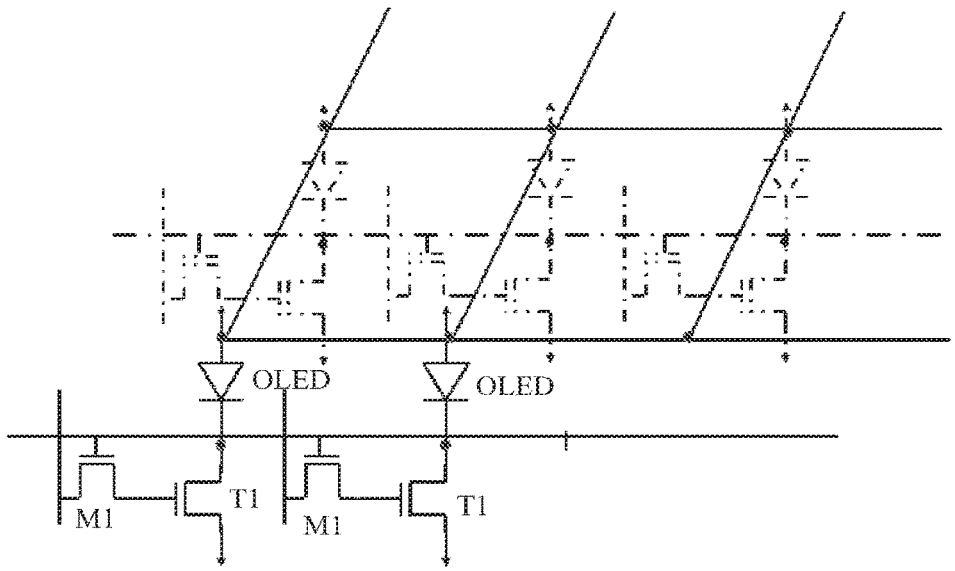

FIG.4

```
forming a pixel driving circuit, a reflective electrode, and a
connection electrode in each pixel region on a base
                         ↓
forming a pixel defining layer, and performing an etching
process on the pixel defining layer to form a first opening at a
position corresponding to the display region and form a second
opening corresponding to the connection region
                         ↓
forming a barrier material, and performing an etching process
on the barrier material to form a barrier layer surrounding the
pixel region
                         ↓
forming a light-emitting material layer in the first opening
by inkjet printing
                         ↓
evaporating a display electrode material which is broken at the
barrier layer such that display electrodes formed in the
respective pixel regions are electrically insulated from each
other
```

FIG. 5

OLED SUBSTRATE AND MANUFACTURING METHOD THEREOF, AND DISPLAY DEVICE

TECHNICAL FIELD

The present application relates to the field of display technology, and more particularly, to an OLED substrate, a method for manufacturing the OLED substrate, and a display device.

BACKGROUND

An OLED (Organic Light-Emitting Device) is a light-emitting device using an organic solid-state semiconductor as a light-emitting material. Due to advantages of simple preparation process, low cost, low power consumption, high luminescence brightness and wide range of operating temperature. OLED has broad application prospects.

SUMMARY

The present application provides an OLED substrate, a method for manufacturing the OLED substrate, and a display device.

The present application provides an OLED substrate which comprises a plurality of pixel regions, and at least one of the plurality of pixel regions is provided with a pixel driving circuit, and comprises a display region and a connection region; wherein, the OLED substrate comprising:

a base;

a reflective electrode layer disposed on the base, wherein the reflective electrode layer comprises a plurality of reflective electrodes, each of which is correspondingly disposed in one display region;

a pixel defining layer disposed on the reflective electrode layer, wherein the pixel defining layer is provided with a first opening corresponding to the display region and a second opening corresponding to the connection region;

a light-emitting material layer disposed in the first opening;

a display electrode continuously disposed on the light emitting material layer and in the second opening, wherein the display electrodes in the respective pixel regions are electrically insulated from each other;

wherein the display electrode in each of the at least one pixel region is electrically coupled to the pixel driving circuit in the pixel region through the second opening.

Optionally, the pixel driving circuit is arranged on the base, a first insulating layer is provided on the pixel driving circuit, and the pixel driving circuit is electrically coupled to the display electrode through a via hole in the first insulating layer and the second opening.

Optionally, a barrier layer surrounding the pixel region is further disposed on the pixel defining layer to separate a display electrode in the pixel region from a display electrode in an adjacent pixel region.

Optionally, a material of the barrier layer includes SiNx or SiOx; and the barrier layer has a thickness of about 20 to 500 nm.

Optionally, an angle between a top surface of the barrier layer away from the pixel defining layer and a side surface of the barrier layer is approximately greater than or equal to 60°.

Optionally, the OLED substrate further comprises a connection electrode disposed on the base in the second opening, and the display electrode is electrically coupled to the pixel driving circuit through the connection electrode.

Optionally, the pixel driving circuit comprises a driving transistor, which comprises a source and a drain; and the connection electrode, the reflective electrode, the source and the drain of the driving transistor are disposed in a same layer by using a same material.

Optionally, the connection electrode is electrically coupled to the drain of the driving transistor.

Optionally, a material of the connection electrode comprises any one of lithium, magnesium and lithium fluoride, and the connection electrode has a thickness of about 0.5 to 2 nm.

Optionally, a material of the reflective electrode comprises aluminum alloy or silver alloy; and the reflective electrode has a thickness of about 60 to 500 nm.

Optionally, a material of the connection electrode includes any one of magnesium, silver, and gold; and the reflective electrode has a thickness of about 7 to 20 nm.

The present application further provides a method for manufacturing the OLED substrate, wherein the OLED substrate comprises a plurality of pixel regions, at least one of which is provided with a pixel driving circuit, and comprises a display region and a connection region;

the method comprising steps as follows:

forming a reflective electrode layer on a base such that the reflective electrode layer comprises a plurality of reflective electrodes and each reflective electrode in the reflective electrode layer is correspondingly disposed in one display region;

forming a pixel defining layer such that the pixel defining layer is provided with a first opening at a position corresponding to the display region and a second opening corresponding to the connection region;

forming a light-emitting material layer in the first opening;

forming a display electrode continuously disposed on the light-emitting material layer and in the second opening such that the display electrodes in the respective pixel regions are electrically insulated from each other;

wherein the display electrode in each of the at least one pixel region is electrically coupled to the pixel driving circuit in the pixel region through the second opening.

Optionally, prior to the step of forming a reflective electrode layer on a base, the method further comprises: forming the pixel driving circuit on the base.

Optionally, between the step of forming a pixel defining layer such that the pixel defining layer is provided with a first opening at a position corresponding to the display region and a second opening corresponding to the connection region, and the step of forming a light-emitting material layer in the first opening, the method further comprising: forming a barrier layer surrounding the pixel region on the pixel defining layer.

Optionally, prior to the step of forming a display electrode continuously disposed on the light-emitting material layer and in the second opening such that the display electrodes in the respective pixel regions are electrically insulated from each other, the method further comprising: forming a connection electrode in the second opening.

Optionally, the connection electrode, the reflective electrode, the source and the drain of the driving transistor are formed by a single patterning process.

Optionally, a material of the reflective electrode comprises aluminum alloy or silver alloy; and the reflective electrode has a thickness of about 60 to 500 nm.

The present application further provides a display device comprising the aforementioned OLED substrate.

BRIEF DESCRIPTION OF THE DRAWINGS

Non-limiting embodiments of the OLED substrate and the method for manufacturing the OLED substrate provided in the present application will be described in detail based on the following figures:

FIG. 4 is a circuit diagram of an OLED substrate in an embodiment of the present application; and FIG. 5 is a flowchart illustrating a method for manufacturing an OLED substrate in an embodiment of the present application.

DETAILED DESCRIPTION

Figure 1:
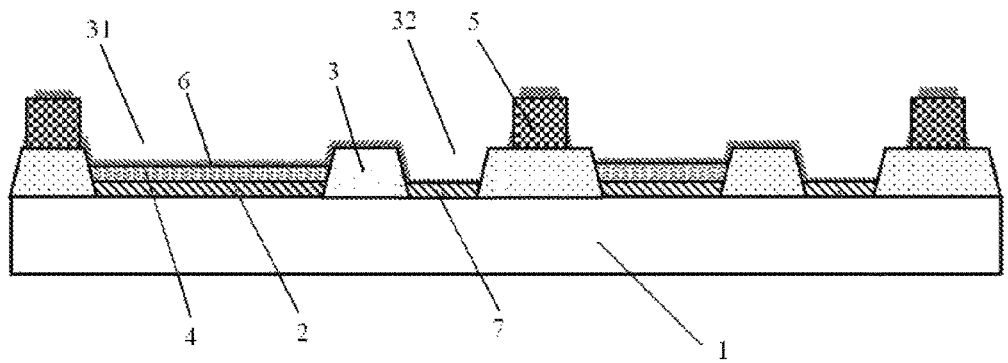
FIG. 1 is a schematic diagram of an OLED substrate in an embodiment of the present application.

The present application will be further described in detail below in conjunction with accompanying drawings and specific embodiments, in order that a person skilled in the art can understand the solutions of the present application better.

An OLED designed with a top emission device structure can increase the aperture ratio, and extend the life of a display. However, for the top emission device structure, using of a thick metal as an upper electrode will lead to large impedance. Current flowing through the upper electrode with large impedance during operation of the OLED device as a current-driven device will result in a large voltage drop, which is known as IR-drop.

To solve the above problem, the present embodiment provides a top emitting OLED substrate which comprises a plurality of pixel regions, each of which includes a display region and a connection region. The OLED substrate of the present embodiment comprises a base 1, a pixel driving circuit and an OLED device in each pixel region disposed on the base 1, and a pixel defining layer 3; wherein each OLED device comprises a reflective electrode 2, a display electrode 6, and a light-emitting material layer 4 between the reflective electrode 2 and the display electrode 6.

To be specific, as shown in FIG. 1, the reflective electrode layer is disposed on the base 1, and comprises a plurality of reflective electrodes 2 coupled to each other, each reflective electrode 2 is correspondingly disposed in one display region; the pixel defining layer 3 is disposed on the reflective electrode layer, the pixel defining layer 3 is provided with a first opening 31 corresponding to the display region and a second opening 32 corresponding to the connection region in each pixel region; the light-emitting material layer 4 is disposed in the first opening 31; the display electrode 6 is continuously disposed on the light-emitting material layer 4 and the second opening 32, and the display electrodes 6 in the respective pixel regions are electrically insulated from each other; the display electrode 6 in each of the pixel regions is electrically coupled to the pixel driving circuit in the pixel region through the second opening 32.

Figure 2:
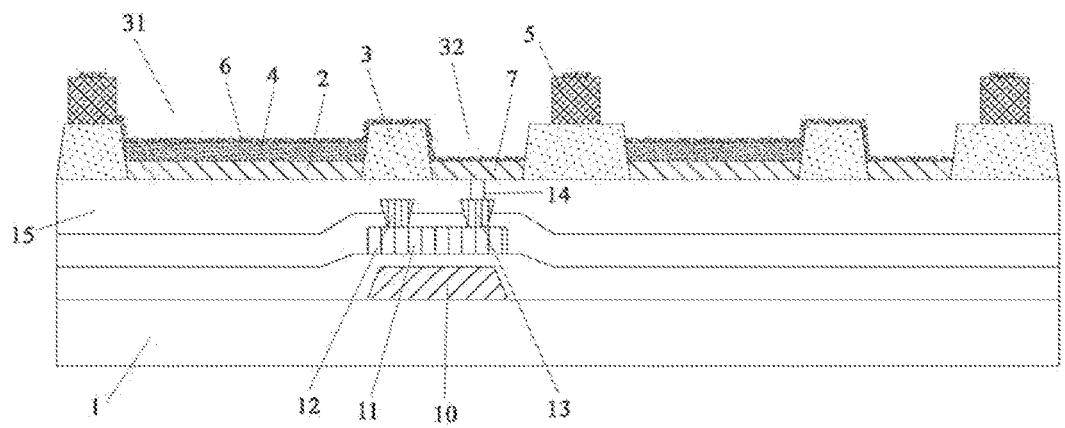
FIG. 2 is a schematic diagram of an OLED substrate in an embodiment of the present application.

For example, FIG. 2 shows a top emitting OLED substrate comprising a pixel driving circuit. The pixel driving circuit comprises a driving transistor, which comprises a gate 10, a gate insulating layer, an active layer 11, a drain 12 and a source 13, and a first insulating layer 15, which are successively provided on the base 1. The display electrode 6 is electrically coupled to the drain 13 of the driving transistor through a via hole 14 in the first insulating layer 15.

Since the display electrodes 6 (i.e. upper electrodes) in the respective pixel regions of the top emitting OLED substrate in the present embodiment are electrically insulated from each other, the problem of IR-Drop caused by the large impedance of the integrated upper electrode of the existing whole OLED substrate can be solved.

Figure 3:
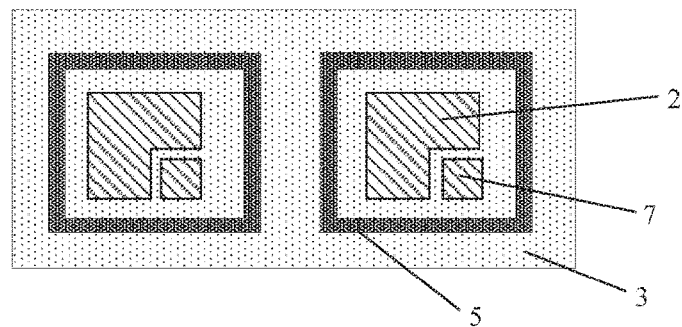
FIG. 3 is a plan view of an OLED substrate in an embodiment of the present application.

A barrier layer 5 surrounding the pixel region can be further disposed on the pixel defining layer 3 of the present embodiment to separate a display electrode in the pixel region from a display electrode in an adjacent pixel region, as shown in FIG. 3. The OLED substrate in this embodiment is a top emission type, and the display electrode 6 as an upper electrode is thin. Due to existence of the barrier layer 5 surrounding the pixel region disposed on the pixel defining layer 3, a material of the display electrode 6, which is subsequently directly vapor-deposited, is broken at the barrier layer 5 such that the display electrodes 6 formed in the respective pixel regions are electrically insulated from each other.

To be specific, a material of the barrier layer 5 includes SiNx or SiOx; the barrier layer 5 has a thickness of about 20 to 500 nm. An angle between a top surface of the barrier layer 5 away from the pixel defining layer 3 and a side surface of the barrier layer 5 is greater than or equal to about 60° such that the material of the vapor-deposited display electrode 6 is broken at the barrier layer 5 and the display electrodes 6 formed in the respective pixel regions are electrically insulated from each other.

In order to prevent the display electrode 6 from being broken between the first opening 31 and the second opening 32 of the pixel defining layer 3, a connection electrode 7 is further provided in the second opening 32 before the display electrode 6 is formed, and the display electrode 6 is electrically coupled to the pixel driving circuit (the drain of the driving transistor in the pixel driving circuit) through the connection electrode 7; of course, it is also feasible without the connection electrode 7, and the display electrode 6 is directly electrically coupled to the pixel driving circuit through the second opening 32 in the case that there is no connection electrode 7 provided in the second opening 32.

Taking a simple 2T1C pixel driving circuit as an example, as shown in FIG. 1, the pixel driving circuit includes a switch transistor M1, a driving transistor T1 and a storage capacitor. In this embodiment, the connection electrode 7 and the reflective electrode 2, and the source and the drain of the driving transistor T1 in the pixel driving circuit can be disposed in a same layer with a same material. That is to say, the connection electrode 7 and the reflective electrode 2, and the source and the drain of the driving transistor T1 in the pixel driving circuit can be prepared by a single patterning process so as to save cost and improve productivity.

Optionally, a material of the connection electrode 7 includes any one of lithium, magnesium and lithium fluoride; the connection electrode 7 has a thickness of about 0.5 to 2 nm. Of course, the material and the thickness of the connecting electrode 7 of the present application are not limited thereto, and can be specifically set according to specific situations.

A material of the reflective electrode 2 includes aluminum alloy or silver alloy; the reflective electrode 2 has a thickness of about 60 to 500 nm. A protective layer may further be disposed between the reflective electrode 2 and the light-emitting material layer 4, and a material of the protective layer includes indium tin oxide.

A material of the display electrode 6 includes any one of magnesium, silver, and gold; and the display electrode 6 has a thickness of about 7 to 20 nm.

In this embodiment, one of the reflective electrode 2 and the display electrode 6 is an anode, and the other is a cathode. Which one of the reflective electrode 2 and the display electrode 6 is an anode and which one is a cathode depends on polarities of voltages applied to the reflective electrode 2 and the display electrode 6. The display electrode 6 is an anode when a positive voltage is applied to the display electrode 6; and the display electrode 6 is a cathode when a negative voltage is applied to the display electrode 6.

Optionally, a hole injection layer and a hole transport layer are provided between the anode and the light-emitting material layer 4; an electron injection layer and an electron transport layer are provided between the cathode and the light-emitting material layer 4.

Specifically, when a voltage is applied between the anode and the cathode, holes injected from the anode enter the light-emitting material layer 4 by passing through the hole injection layer and the hole transport layer and electrons injected from the cathode enter the light-emitting material layer 4 by passing through the electron injection layer and the electron transport layer under driving of the external voltage, the holes and electrons entering the light-emitting material layer 4 recombine to generate excitons in a composite region, radiative transition of the excitons will emit light, causing a luminescent phenomenon (that is, electroluminescence).

As shown in FIG. 5, the present embodiment provides a method for manufacturing an OLED substrate, which comprises the steps as follows:

Step 1: forming a pixel driving circuit in each pixel region on a base 1. To be specific, taking a simple 2T1C pixel driving circuit as an example, the pixel driving circuit includes a switch transistor M1, a driving transistor T1 and a storage capacitor, wherein both the switch transistor M1 and the driving transistor T1 include a gate, a source, and a drain; optionally, a reflective electrode layer is also formed while forming the source and the drain, wherein the reflective electrode layer comprises a plurality of reflective electrodes 2, which are coupled to each other, and each of the reflective electrodes 2 is correspondingly disposed in one display region. Here, it should be noted that, the reflective electrode 2, the source and the drain can be formed by a single patterning process in order to simplify manufacturing process and improve productivity.

Further, the connection electrode 7 may also be formed in the connection region while forming the reflective electrode 2, the source and the drain, and the connection electrode 7 is electrically coupled to the drain of the driving transistor T1 so that the display electrode 6 formed later can be electrically coupled to the drain of the driving transistor T1 through the connection electrode 7.

A material of the reflective electrode 2 includes aluminum alloy or silver alloy; the reflective electrode 2 has a thickness of about 60 to 500 nm. A protective layer may further be disposed between the reflective electrode 2 and the light-emitting material layer 4, and a material of the protective layer includes indium tin oxide.

A material of the connection electrode 7 is selected from any one of lithium, magnesium and lithium fluoride; and the connection electrode 7 has a thickness of about 0.5 to 2 nm.

Of course, the material and the thickness of the connecting electrode 7 are not limited thereto, and can be specifically set according to specific situations.

Step 2: forming a pixel defining layer 3 on the base 1 subjected to the above step 1, and performing an etching process on the pixel defining layer 3 to form a first opening 31 at a position corresponding to the display region and form a second opening 32 at a position corresponding to the connection region.

Step 3: forming a barrier material on the base 1 subjected to the above step 2, and performing an etching process on the barrier material to form a barrier layer 5 surrounding the pixel region.

A material of the barrier layer 5 includes SiNx or SiOx; the barrier layer 5 has a thickness of about 20 to 500 nm. An angle between a top surface of the barrier layer 5 away from the pixel defining layer 3 and a side surface of the barrier layer 5 is greater than or equal to about 60° such that the material of the vapor-deposited display electrode 6 is broken at the barrier layer 5 and the display electrodes 6 formed in the respective pixel regions are electrically insulated from each other.

Step 4: forming a light-emitting material layer 4 in the first opening 31 by inkjet printing on the base 1 subjected to the above step 3.

Step 5: evaporating a material of the display electrode 6 on the base 1 subjected to the above step 4. Due to existence of the barrier layer 5, the material of the display electrode 6 in each pixel region is broken at the barrier layer 5, that is, the display electrodes 6 formed in the respective pixel regions are electrically insulated from each other; the display electrode 6 in each of the pixel regions covers the light-emitting material layer 4 and the second opening 32 and is electrically coupled to the pixel driving circuit through the second opening 32; if the connection electrode 7 is provided, the display electrode 6 is electrically coupled to the pixel driving circuit through the connection electrode 7.

A material of the barrier layer 5 includes SiNx or SiOx; the barrier layer 5 has a thickness of about 20 to 500 nm. An angle between a top surface of the barrier layer 5 away from the pixel defining layer 3 and a side surface of the barrier layer 5 is approximately greater than or equal to 60° such that the material of the vapor-deposited display electrode 6 is broken at the barrier layer 5 and the display electrodes 6 formed in the respective pixel regions are electrically insulated from each other.

Since the display electrodes 6 (i.e. upper electrodes) in the respective pixel regions of the top emitting OLED substrate formed by the manufacturing method in the present embodiment are electrically insulated from each other, the problem of IR-Drop caused by the large impedance of the integrated upper electrode of the existing whole OLED substrate can be solved.

The present application further provides a display device comprising the OLED substrate in the above embodiment. Therefore, the display device of the present embodiment has a better display effect.

The display device may be an electroluminescent display device, for example, any product or component having a display function such as an OLED panel, a cell phone, a tablet computer, a television, a display, a notebook computer, a digital photo frame, a navigator and the like.

It will be appreciated that the above embodiments are exemplary implementations for the purpose of illustrating the principle of the present application only, and the present application is not limited thereto. It will be apparent to a person skilled in the art that many variations and modifications may be made without departing from the spirit and essence of the present application. These variations and modifications should also be considered as the protective scope of the present application.

What is claimed is:

1. An organic light-emitting display (OLED) substrate, comprising a plurality of pixel regions, at least one of the plurality of pixel regions provided with a pixel driving circuit, and comprising a display region and a connection region; wherein,
the OLED substrate comprises:
a base;
a reflective electrode layer disposed on the base, wherein the reflective electrode layer comprises a plurality of reflective electrodes, each of which is correspondingly disposed in one display region;
a pixel defining layer disposed on the reflective electrode layer, wherein the pixel defining layer is provided with a first opening corresponding to the display region and a second opening corresponding to the connection region;
a light-emitting material layer disposed in the first opening;
a display electrode continuously disposed on the light-emitting material layer and in the second opening, wherein the display electrodes in the respective pixel regions are electrically insulated from each other,
wherein the display electrode in each of the at least one pixel region is electrically coupled to the pixel driving circuit in the pixel region through the second opening, and
a barrier layer surrounding one pixel region provided with a pixel driving circuit is disposed on the pixel defining layer, wherein the barrier layer has a thickness of about 20 to 500 nm, and an angle between a top surface of the barrier layer away from the pixel defining layer and a side surface of the barrier layer is greater than or equal to about 60° such that the display electrode is broken at the side surface of the barrier layer to separate a display electrode in the one pixel region from a display electrode in an adjacent pixel region.

2. The OLED substrate according to claim 1, wherein the pixel driving circuit is arranged on the base, a first insulating layer is provided on the pixel driving circuit, and the pixel driving circuit is electrically coupled to the display electrode through a via hole in the first insulating layer and the second opening.

3. The OLED substrate according to claim 2, wherein a material of the barrier layer includes SiNx or SiOx.

4. The OLED substrate according to claim 1, further comprising a connection electrode disposed on the base in the second opening, and the display electrode is electrically coupled to the pixel driving circuit through the connection electrode.

5. The OLED substrate according to claim 4, wherein the pixel driving circuit comprises a driving transistor, which comprises a source and a drain; and the connection electrode, the reflective electrode, the source and the drain of the driving transistor are disposed in a same layer by using a same material.

6. The OLED substrate according to claim 5, wherein the connection electrode is electrically coupled to the drain of the driving transistor.

7. The OLED substrate according to claim 4, wherein a material of the connection electrode comprises any one of lithium, magnesium and lithium fluoride; and the connection electrode has a thickness of about 0.5 to 2 nm.

8. The OLED substrate according to claim 1, wherein a material of the reflective electrode includes aluminum alloy or silver alloy; and the reflective electrode has a thickness of about 60 to 500 nm.

9. The OLED substrate according to claim 8, wherein a material of the display electrode includes any one of magnesium, silver, and gold; and the reflective electrode has a thickness of about 7 to 20 nm.

10. A display device comprising the OLED substrate according to claim 1.

11. A method for manufacturing an OLED substrate, wherein the OLED substrate comprises a plurality of pixel regions, at least one of which is provided with a pixel driving circuit, and comprises a display region and a connection region; the method comprising steps as follows:
forming a reflective electrode layer on a base such that the reflective electrode layer comprises a plurality of reflective electrodes and each reflective electrode is correspondingly disposed in one display region;
forming a pixel defining layer such that the pixel defining layer is provided with a first opening at a position corresponding to the display region and a second opening corresponding to the connection region;
forming a light-emitting material layer in the first opening;
forming a barrier layer surrounding one pixel region provided with a pixel driving circuit on the pixel defining layer, wherein the barrier layer has a thickness of about 20 to 500 nm, and an angle between a top surface of the barrier layer away from the pixel defining layer and a side surface of the barrier layer is greater than or equal to about 60°;
forming a display electrode continuously disposed on the light-emitting material layer and in the second opening but broken at the side surface of the barrier layer such that the display electrodes in the respective pixel regions are electrically insulated from each other;
wherein the display electrode in each of the at least one pixel region is electrically coupled to the pixel driving circuit in the pixel region through the second opening.

12. The method for manufacturing the OLED substrate according to claim 11, wherein prior to the step of forming a reflective electrode layer on a base, the method further comprises: forming the pixel driving circuit on the base.

13. The method for manufacturing the OLED substrate according to claim 11, wherein prior to the step of forming a display electrode continuously disposed on the light-emitting material layer and in the second opening such that the display electrodes in the respective pixel regions are electrically insulated from each other, the method further comprising:
forming a connection electrode in the second opening.

14. The method for manufacturing the OLED substrate according to claim 13, wherein the connection electrode, the reflective electrode, the source and the drain of the driving transistor in the pixel driving circuit are formed by a single patterning process.

15. The method for manufacturing the OLED substrate according to claim 11, wherein a material of the reflective electrode comprises aluminum alloy or silver alloy; and the reflective electrode has a thickness of about 60 to 500 nm.

16. The method for manufacturing the OLED substrate according to claim 11, wherein a material of the barrier layer includes SiNx or SiOx.

* * * * *